(12) United States Patent
Lai et al.

(10) Patent No.: US 10,509,500 B2
(45) Date of Patent: Dec. 17, 2019

(54) TOUCH DISPLAY APPARATUS

(71) Applicant: Au Optronics Corporation, Hsinchu (TW)

(72) Inventors: Chun-Chi Lai, Taipei (TW);
Chia-Hsien Chu, Hsinchu (TW);
Chia-Yuan Yeh, Hsinchu (TW);
Kuan-Ting Chen, Hsinchu (TW);
Chee-Wai Lau, Hsinchu County (TW);
An-Hsiung Hsieh, Hsinchu (TW);
Feng-Sheng Lin, Hsinchu (TW);
Tsang-Hong Wang, Chiayi (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/036,957

(22) Filed: Jul. 17, 2018

(65) Prior Publication Data
US 2019/0196630 A1    Jun. 27, 2019

(30) Foreign Application Priority Data

Dec. 25, 2017 (TW) .............................. 106145479 A

(51) Int. Cl.
G06F 3/044 (2006.01)
G06F 3/041 (2006.01)
H01L 27/32 (2006.01)

(52) U.S. Cl.
CPC ............ *G06F 3/0412* (2013.01); *G06F 3/044* (2013.01); *H01L 27/323* (2013.01); *H01L 27/3246* (2013.01); *G06F 2203/04112* (2013.01); *H01L 27/3262* (2013.01)

(58) Field of Classification Search
None
See application file for complete search history.

(56) References Cited

U.S. PATENT DOCUMENTS

2017/0024075 A1    1/2017 Chiang et al.
2017/0269440 A1*   9/2017 Yoshitomi ......... G02F 1/134309

FOREIGN PATENT DOCUMENTS

CN    105182588    12/2015
CN    106371649    2/2017

* cited by examiner

Primary Examiner — Brian M Butcher
(74) Attorney, Agent, or Firm — JCIPRNET

(57) ABSTRACT

A touch display apparatus including a first substrate, a first sub-pixel, a spacer, a second substrate, and a touch-sensing electrode is provided. The first sub-pixel is disposed on the first substrate. The spacer is disposed on the first substrate. The touch-sensing electrode is disposed on the second substrate and has a first opening. The spacer is located inside the first opening in an orthogonal projection direction. A distance D is defined between an outline of an orthogonal projection of the spacer on the first substrate and an outline of an orthogonal projection of the first opening on the first substrate, and D≥5 μm.

9 Claims, 3 Drawing Sheets

TOUCH DISPLAY APPARATUS

CROSS-REFERENCE TO RELATED APPLICATION

This application claims the priority benefit of Taiwan application serial no. 106145479, filed on Dec. 25, 2017. The entirety of the above-mentioned patent application is hereby incorporated by reference herein and made a part of this specification.

BACKGROUND OF THE INVENTION

Field of the Invention

The invention relates to a display apparatus, and particularly to a touch display apparatus.

Description of Related Art

Touch display apparatuses can generally be divided into out-cell types, on-cell types, and in-cell types according to the relative location of the touch-sensing electrode and display panel. Comparing with the out-cell and on-cell types of touch display apparatuses, the in-cell types of touch display apparatuses have the advantages in being thinned more easily. The in-cell types of touch display apparatuses are thus broadly applied in various electronic devices.

When the upper substrate of an in-cell type of touch display apparatus is pressed, however, the touch-sensing electrode disposed on an inner surface of the upper substrate bends towards the lower substrate. The capacitance between the touch-sensing electrode and the members (e.g. the spacer) on the lower substrate of the display panel changes overly drastically and results in bending noise. Moreover, when the in-cell type of touch display apparatuses are pressed, some of the members (e.g. the spacer) of the display panel will be deformed. The time required for the members to recover to their original statuses further results in lagging noise. Both the bending noise and the lagging noise reduce the touch effect of the touch display apparatuses.

SUMMARY OF THE INVENTION

A touch display apparatus with excellent touch effect is provided in the invention.

The touch display apparatus according to the invention includes a first substrate, a first sub-pixel, a spacer, a second substrate, and a touch-sensing electrode. The first sub-pixel is disposed on the first substrate. The spacer is disposed on the first substrate. The second substrate is disposed opposite to the first substrate. The touch-sensing electrode is disposed on the second substrate and has a first opening. The spacer is located inside the first opening in an orthogonal projection direction. A distance D is defined between an outline of an orthogonal projection of the spacer on the first substrate and an outline of an orthogonal projection of the first opening on the first substrate, and D≥5 μm.

According to an exemplary embodiment of the invention, the spacer has a top surface located close to the second substrate, a bottom surface located far from the second substrate, and a sidewall located between and connecting the top surface and the bottom surface. An outline of an orthogonal projection of the spacer on the first substrate is an outline of an orthogonal projection of the top surface on the first substrate.

According to an exemplary embodiment of the invention, the first substrate has a pixel repetition area. The touch display apparatus further includes a second sub-pixel and a third sub-pixel. The first sub-pixel, the second sub-pixel, and the third sub-pixel are respectively used to emit first colored light, second colored light, and third colored light. At least the first sub-pixel, the second sub-pixel, the third sub-pixel, and the spacer are disposed adjacent to one another in the pixel repetition area. An area of an orthogonal projection of the spacer on the first substrate is A1, an area of the pixel repetition area is A2, and $$\left(\frac{A1}{A2}\right) \times 100\% \geq 10.25\%.$$

According to an exemplary embodiment of the invention, the touch-sensing electrode is located between the first substrate and the second substrate.

According to an exemplary embodiment of the invention, the touch display apparatus further includes a passivation layer. The passivation layer is disposed on the second substrate, covers a body of the touch-sensing electrode, and fills in the first opening of the touch-sensing electrode.

According to an exemplary embodiment of the invention, a top of the spacer is abutted to part of the passication layer located inside the first opening.

According to an exemplary embodiment of the invention, the first sub-pixel includes a thin-film transistor, a first electrode, a light-emitting pattern, and a second electrode. The first electrode is electrically connected to the thin-film transistor. The light-emitting pattern is disposed on the first electrode. The second electrode covers the light-emitting pattern. The spacer is disposed next to the light-emitting pattern. The second electrode further covers the spacer.

According to an exemplary embodiment of the invention, the touch-sensing electrode further includes a second opening. The second opening of the touch-sensing electrode overlaps with the light-emitting pattern in an orthogonal projection direction.

According to an exemplary embodiment of the invention, the touch-sensing electrode is a metal mesh electrode.

Based on the foregoing, the spacer is disposed inside the first opening of the touch-sensing electrode in an orthogonal projection direction. A distance D is defined between an outline of an orthogonal projection of the spacer on the first substrate and an outline of an orthogonal projection of the first opening on the first substrate, and D≥5 μm. In other words, a sufficient distance is maintained between an edge of the touch-sensing electrode and the spacer. Since the distance between the edge of the touch-sensing electrode and the spacer is sufficiently large, capacitance between the touch-sensing electrode and the spacer is extremely low. As a result, before or after the touch display apparatus is pressed by an object, that is to say before or after the spacer is squeezed, the capacitance between the touch-sensing electrode and the spacer has a very limited influence on determining a touch location. The lagging noise is thus reduced and the touch effect is improved.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
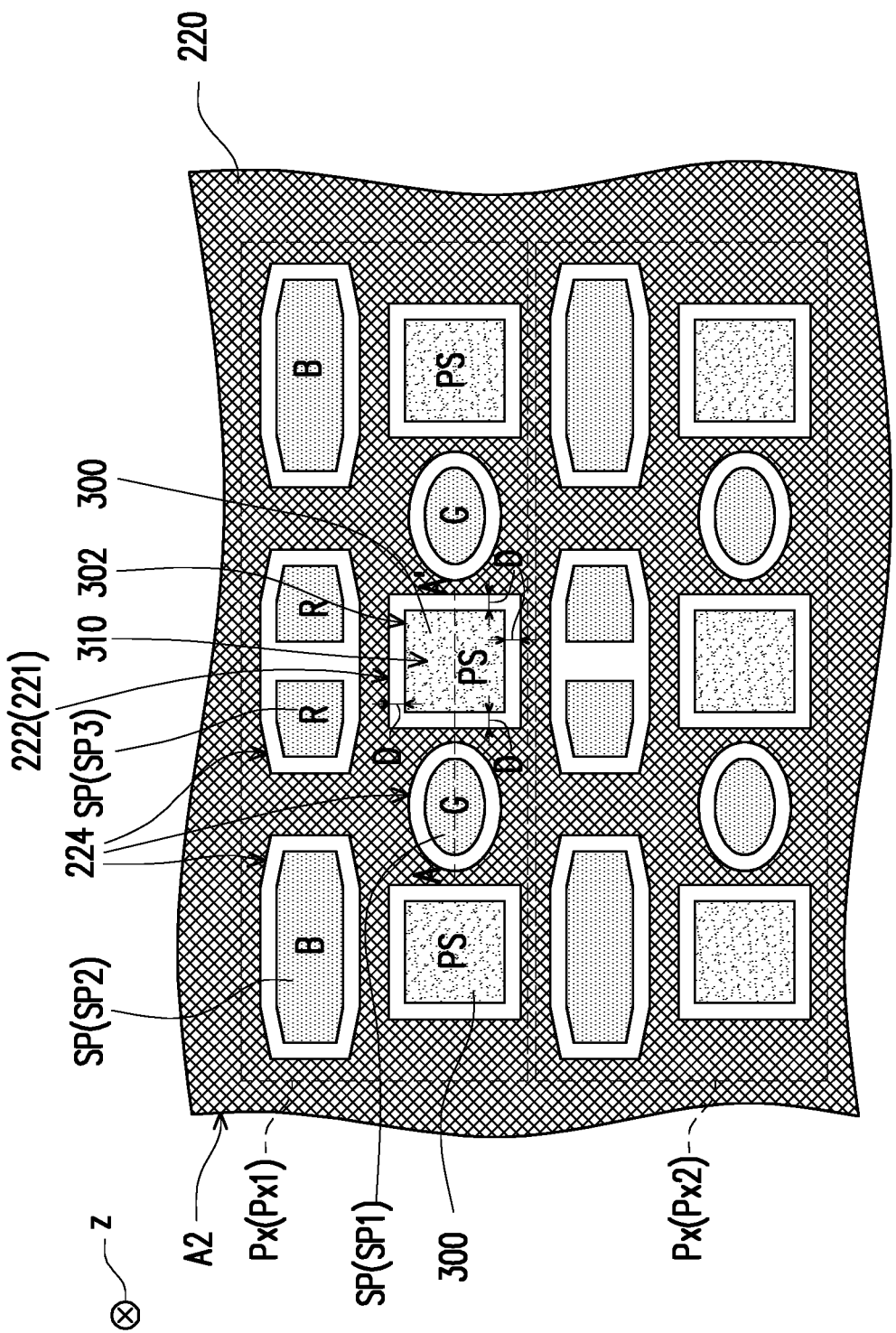
FIG. 1 is a top view of part of a touch display apparatus according to an exemplary embodiment of the invention.
Figure 2:
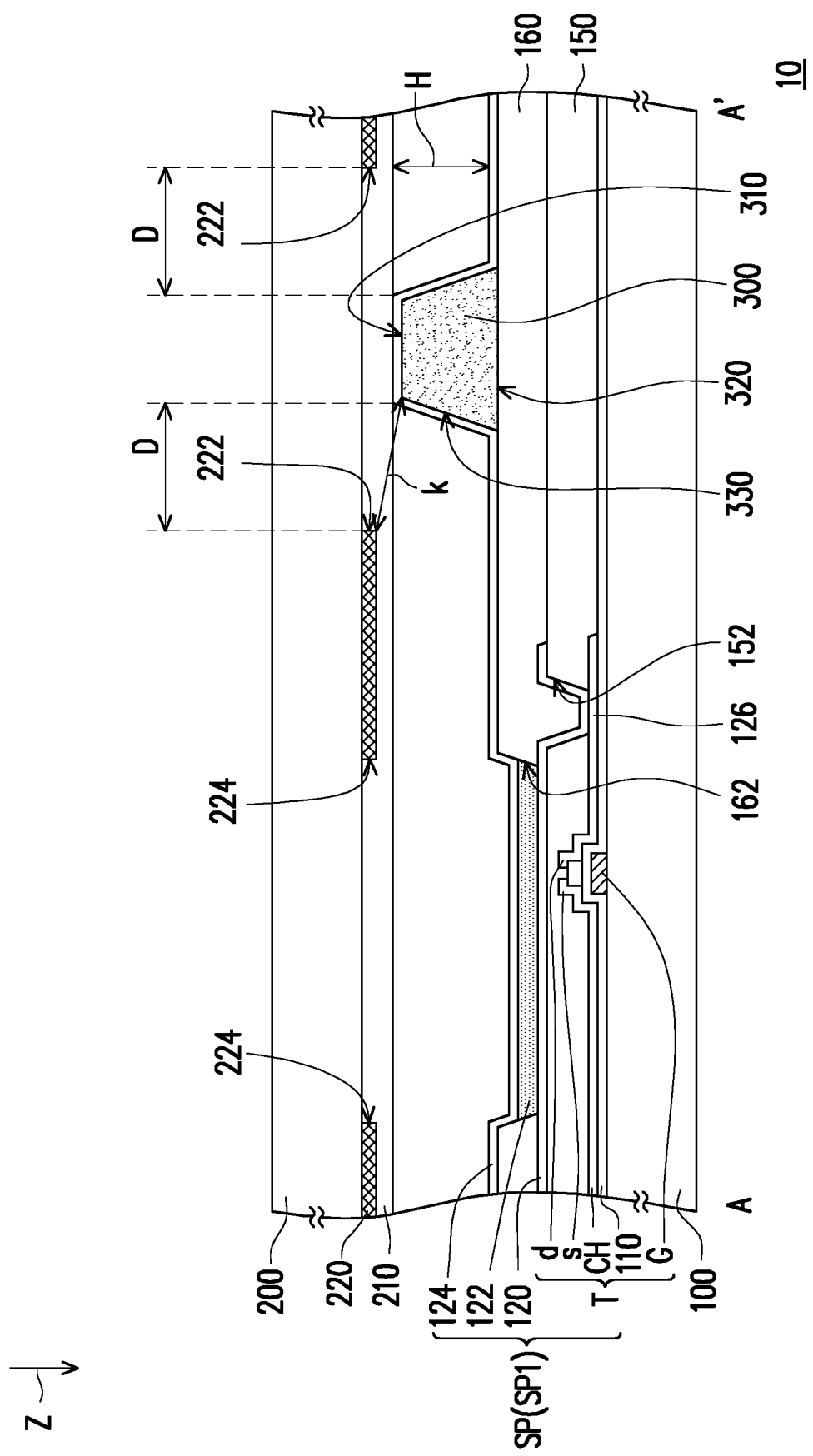
FIG. 2 is a cross-sectional view of part of a touch display apparatus according to an exemplary embodiment of the invention.

FIG. 1 is a top view of part of a touch display apparatus according to an exemplary embodiment of the invention. FIG. 2 is a cross-sectional view of part of a touch display apparatus according to an exemplary embodiment of the invention. A cut plane of a touch display apparatus 10 illustrated in FIG. 2 is correspondent to a cut line A-A' in FIG. 1.

Referring to FIG. 1 and FIG. 2, the touch display apparatus 10 includes a first substrate 100, a plurality of sub-pixels SP, a spacer 300, a second substrate 200, and a touch-sensing electrode 220. The plurality of sub-pixels SP are disposed on the first substrate 100. According to this exemplary embodiment, each sub-pixel SP among the plurality of sub-pixels SP includes a thin-film transistor T, a first electrode 120 electrically connected to the thin-film transistor T, a light-emitting pattern 122 disposed on the first electrode 120, and a second electrode 124 covering the light-emitting pattern 122. The thin-film transistor T includes a gate G, a semiconductor pattern CH, a gate insulating layer 110 disposed between the semiconductor pattern CH and the gate G, and a source s and a drain d respectively electrically connected to two different regions of the semiconductor pattern CH.

For example, according to this exemplary embodiment, the touch display apparatus 10 further includes a conductive pattern 126 and a flat layer 150. The conductive pattern 126 extends outwards from the drain d and is electrically connected to the drain d. According to this exemplary embodiment, the conductive pattern 126 and the drain d may optionally be formed on a same film layer. Nevertheless, the invention is not limited thereto. The flat layer 150 covers the thin-film transistor T and part of the conductive pattern 126. The flat layer 150 has an opening 152 overlapping with another part of the conductive pattern 126. According to this exemplary embodiment, the first electrode 120 of each of the plurality of sub-pixels SP is disposed on the flat layer 150 and is electrically connected to the drain d of the thin-film transistor T through the opening 152 of the flat layer 150 and the conductive pattern 126. Nevertheless, the invention is not limited thereto. According to an alternative embodiment, the first electrode 120 of each of the plurality of sub-pixels SP may be electrically connected to the drain d of the thin-film transistor T in other ways.

According to this exemplary embodiment, the touch display apparatus 10 further includes a pixel defining layer 160. The pixel defining layer 160 is disposed on the flat layer 150 and has an opening 162 overlapping with part of the first electrode 120. The light-emitting pattern 122 is disposed inside the opening 162 of the pixel defining layer 160 and is electrically connected to the first electrode 120. According to this exemplary embodiment, the light-emitting pattern 122 is, for example, an organic light-emitting diode layer.

The second electrode 124 of each of the plurality of sub-pixels SP may be disposed on the pixel defining layer 160 and may fill in the opening 162 of the pixel defining layer 160, such that the second electrode 124 of each of the plurality of sub-pixels SP is electrically connected to the light-emitting pattern 122.

The spacer 300 is disposed on the first substrate 100. For example, according to this exemplary embodiment, the spacer 300 is disposed on the pixel defining layer 160 and is located next to the light-emitting pattern 122. The second electrode 124 of each of the plurality of sub-pixels SP covers the spacer 300. Nevertheless, the invention is not limited thereto. According to an alternative embodiment, the spacer 300 may also be disposed on the first substrate 100 in other ways. According to this exemplary embodiment, a material of the spacer 300 is, for example, an inorganic material. Nevertheless, the invention is not limited thereto.

The second substrate 200 is disposed opposite to the first substrate 100. The touch-sensing electrode 220 is disposed on the second substrate 200 and is located between the first substrate 100 and the second substrate 200. The touch-sensing electrode 220 is used to sense a capacitance change generated by a touch of an object, so as to determine a touch location of the object, such as a finger or a touch pen. The touch-sensing electrode 220 has a first opening 222. According to this exemplary embodiment, the touch display apparatus 10 further includes a passivation layer 210. The passivation layer 210 is disposed on the second substrate 200, covers a body of the touch-sensing electrode 220, and fills in the first opening 222 of the touch-sensing electrode 220. The spacer 300 is located inside the first opening 222 of the touch-sensing electrode 220 in an orthogonal projection direction z. Top of the spacer 300 is abutted to part of the passivation layer 210 located inside the first opening 222, such that an inner gap H of the touch display apparatus 10 is maintained.

According to this exemplary embodiment, the touch display apparatus 10 is, for example, an organic light-emitting diode display emitting light from above and the touch-sensing electrode 220 may optionally include a second opening 224. The second opening 224 of the touch-sensing electrode 220 overlaps with the light-emitting pattern 122 in the orthogonal projection direction z, such that light emitted by the light-emitting pattern 122 may be emitted from the second opening 224 of the touch-sensing electrode 220. According to this exemplary embodiment, the touch-sensing electrode 220 may optionally be a metal mesh electrode. Nevertheless, the invention is not limited thereto. According to an alternative embodiment, the touch-sensing electrode 220 may not include the second opening 224. For example, according to another alternative embodiment, the touch-sensing electrode 220 may be a transparent electrode and the touch-sensing electrode 220 may not include the second opening 224.

It should be noted that a distance D is defined between an outline 302 of an orthogonal projection of the spacer 300 on the first substrate 100 and an outline 221 of an orthogonal projection of the first opening 222 on the first substrate 100, and $D \geq 5$ μm. In other words, a sufficient distance k is maintained between an edge of the touch-sensing electrode 220 and the spacer 300. Since the distance k is sufficiently large, capacitance between the touch-sensing electrode 220 and the space 300 is extremely low. As a result, before or after the second substrate 200 is pressed by an object, or before or after the spacer 300 is squeezed, capacitance between the touch-sensing electrode 220 and the spacer 300 has a very limited influence on determining a touch location. The lagging noise is thus reduced and the touch effect is improved.

The spacer 300 has a top surface 310 located close to the second substrate 200, a bottom surface 320 located far from the second substrate 200, and a sidewall 330 located between and connecting the top surface 310 and the bottom surface 320. According to this exemplary embodiment, the outline 302 of an orthogonal projection of the spacer 300 on the first substrate 100 may be an outline of an orthogonal projection of the top surface 310 of the spacer 300 on the first substrate 100. Nevertheless, the invention is not limited thereto.

Referring to FIG. 1, according to this exemplary embodiment, the plurality of sub-pixels SP may include a first sub-pixel SP1, a second sub-pixel SP2, and a third sub-pixel SP3 respectively used to emit first colored light, second colored light, and third colored light that are different from one another. For example, according to this exemplary embodiment, the first colored light, the second colored light, and the third colored light are, for example, respectively green light, blue light, and red light. Nevertheless, the invention is not limited thereto.

According to this exemplary embodiment, the first substrate 100 has a plurality of pixel repetition areas Px. A plurality of identical elements are respectively disposed on the plurality of pixel repetition areas Px in a same arrangement. For example, according to this exemplary embodiment, two first sub-pixels SP1, two second sub-pixels SP2, two third sub-pixels SP3, and two spacers 300 may be disposed adjacent to one another in each of the plurality of pixel repetition areas Px. Random two pixel repetition areas Px1 and Px2 among the plurality of pixel repetition areas Px are adjacent to each other. Two first sub-pixels SP1, two second sub-pixels SP2, two third sub-pixels SP3, and two spacers 300 disposed in the pixel repetition area Px1 are arranged in a same arrangement as two first sub-pixels SP1, two second sub-pixels SP2, two third sub-pixels SP3, and two spacers 300 disposed in the pixel repetition areas Px2.

It should be explained that numbers and arrangements of the first sub-pixels SP1, the second sub-pixels SP2, the third sub-pixels SP3, and the spacers 300 disposed in each of the plurality of the pixel repetition areas Px provided above are given only as examples but not to limit the invention. According to an alternative embodiment, numbers and arrangements of the first sub-pixels SP1, the second sub-pixels SP2, the third sub-pixels SP3, and the spacers 300 may differ from what is illustrated in FIG. 1.

It should be noted that, according to this exemplary embodiment, an area of an orthogonal projection of the spacer 300 on the first substrate 100 in any of the plurality of pixel repetition areas Px is A1. The area A1 may be an area of all of the outlines 302 of the spacers 300. An area of any of the plurality of pixel repetition areas Px where the spacers 300 are located is A2, and $$\left(\frac{A1}{A2}\right) \times 100\% = DR.$$

DR may be a density of the spacer 300 in a pixel repetition area Px among the plurality of pixel repetition areas Px. According to this exemplary embodiment, DR is greater than or equal to 10.25%. In other words, $$\left(\frac{A1}{A2}\right) \times 100\% \geq 10.25\%.$$

When DR is greater than or equal to 10.25%, the spacer 300 may provide sufficient support under the condition that D≥5 µm. So when an object contacts the touch display apparatus 10, the touch-sensing electrode 220 on the second substrate 200 does not overly bend towards the first substrate 100. The bending noise is thus reduced and the touch effect is improved.

Figure 3:
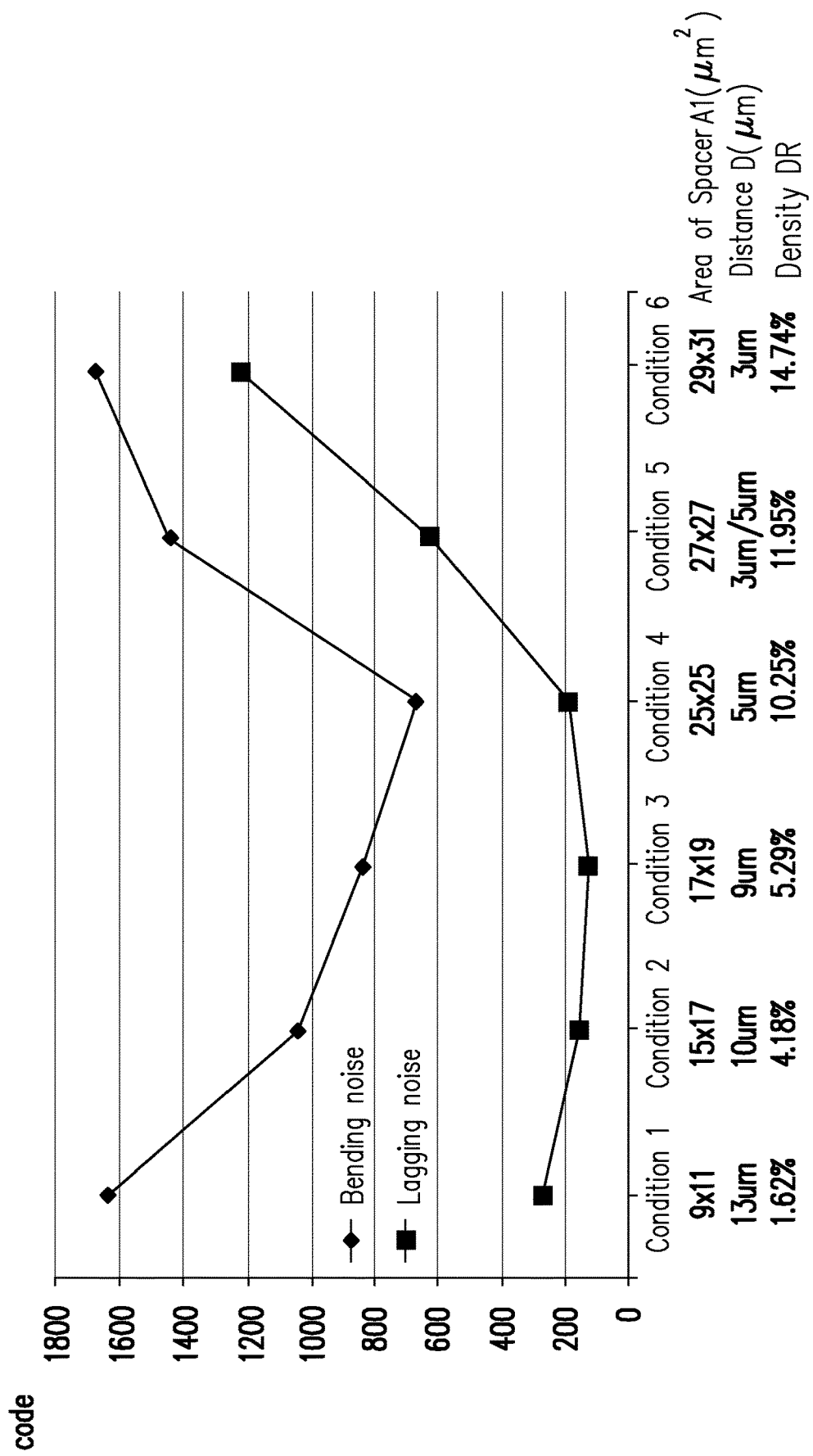
FIG. 3 illustrates bending noise and lagging noise of a touch display apparatus under each of a variety of conditions.

FIG. 3 illustrates bending noise and lagging noise of a touch display apparatus under each of a variety of conditions. A condition 1 is when an area A1 of a spacer is 9×11 µm², D=13 µm, and DR=1.62%. A condition 2 is when an area A1 of a spacer is 15×17 µm², D=10 µm, and DR=4.18%. A condition 3 is when an area A1 of a spacer is 17×19 µm², D=9 µm, and DR=5.29%. A condition 4 is when an area A1 of a spacer is 25×25 µm², D=5 µm, and DR=10.25%. A condition 5 is when an area A1 of a spacer is 27×27 µm², D=3 µm or 5 µm, and DR=11.95%. A condition 6 is when an area A1 of a spacer is 29×31 µm², D=3 µm, and DR=14.74%. In view of the experimental data provided in FIG. 3, capacitance between the touch-sensing electrode 220 and the spacer 300 is low enough to minimize lagging noise when D is greater than or equal to 5 µm. Density of the spacer 300 in the plurality of pixel repetition areas Px is high enough to minimize bending noise when DR is greater than or equal to 10.25%.

In conclusion of the foregoing, the touch display apparatus according to an embodiment of the invention includes the first substrate, the plurality of sub-pixels, the spacer, the second substrate, and the touch-sensing electrode. The plurality of sub-pixels are disposed on the first substrate. The spacer is disposed on the first substrate. The touch-sensing electrode is disposed on the second substrate and has the first opening. The spacer is located inside the first opening in an orthogonal projection direction. The distance D is defined between an outline of an orthogonal projection of the spacer on the first substrate and an outline of an orthogonal projection of the first opening on the first substrate, and D≥5 µm. In other words, a sufficient distance is maintained between an edge of the touch-sensing electrode and the spacer. Since the distance between the edge of the touch-sensing electrode and the spacer is sufficiently large, capacitance between the touch-sensing electrode and the spacer is extremely low. As a result, before or after the touch display apparatus is pressed by an object, or before or after the spacer is squeezed, the capacitance between the touch-sensing electrode and the spacer has a very limited influence on determining a touch location. The lagging noise is thus reduced and the touch effect is improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A touch display apparatus comprising:
a first substrate;
a first sub-pixel disposed on the first substrate;
a spacer disposed on the first substrate;
a second substrate disposed opposite to the first substrate; and a touch-sensing electrode disposed on the second substrate and having a first opening, wherein the spacer is located inside the first opening in an orthogonal projection direction, a distance D is defined between an outline of an orthogonal projection of the spacer on the first substrate and an outline of an orthogonal projection of the first opening on the first substrate, and $D \geq 5$ μm (micrometers).

2. The touch display apparatus according to claim 1, wherein the spacer has a top surface located close to the second substrate, a bottom surface located far from the second substrate, and a sidewall located between and connecting the top surface and the bottom surface, an outline of an orthogonal projection of the spacer on the first substrate is an outline of an orthogonal projection of the top surface on the first substrate.

3. The touch display apparatus according to claim 1, wherein the first substrate has a pixel repetition area, the touch display apparatus further comprises:
 a second sub-pixel and a third sub-pixel, wherein the first sub-pixel, the second sub-pixel, and the third sub-pixel are respectively used to emit a first colored light, a second colored light, and a third colored light, at least the first sub-pixel, the second sub-pixel, the third sub-pixel, and the spacer are disposed adjacent to one another in the pixel repetition area, an area of an orthogonal projection of the spacer on the first substrate is A1, an area of the pixel repetition area is A2, and $$\left(\frac{A1}{A2}\right) \times 100\% \geq 10.25\%.$$

4. The touch display apparatus according to claim 1, wherein the touch-sensing electrode is located between the first substrate and the second substrate.

5. The touch display apparatus according to claim 4, further comprising:
 a passivation layer disposed on the second substrate, covering a body of the touch-sensing electrode and filling in the first opening of the touch-sensing electrode.

6. The touch display apparatus according to claim 5, wherein a top of the spacer is abutted to part of the passivation layer located inside the first opening.

7. The touch display apparatus according to claim 1, wherein the first sub-pixel comprises:
 a thin-film transistor;
 a first electrode electrically connected to the thin-film transistor;
 a light-emitting pattern disposed on the first electrode; and
 a second electrode covering the light-emitting pattern, wherein the spacer is disposed next to the light-emitting pattern, and the second electrode further covers the spacer.

8. The touch display apparatus according to claim 7, wherein the touch-sensing electrode further comprises a second opening, the second opening of the touch-sensing electrode overlaps with the light-emitting pattern in an orthogonal projection direction.

9. The touch display apparatus according to claim 1, wherein the touch-sensing electrode is a metal mesh electrode.

* * * * *